(12) United States Patent
Byun et al.

(10) Patent No.: US 9,195,353 B2
(45) Date of Patent: Nov. 24, 2015

(54) TOUCH CONTROLLERS, METHODS THEREOF, AND DEVICES HAVING THE TOUCH CONTROLLERS

(75) Inventors: San-Ho Byun, Bucheon-si (KR); Ki-Duk Kim, Hwaseong-si (KR); Yoon Kyung Choi, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 511 days.

(21) Appl. No.: 13/605,247

(22) Filed: Sep. 6, 2012

(65) Prior Publication Data

US 2013/0063395 A1  Mar. 14, 2013

Related U.S. Application Data

(60) Provisional application No. 61/532,697, filed on Sep. 9, 2011.

(30) Foreign Application Priority Data

May 14, 2012 (KR) .......................... 10-2012-0051060

(51) Int. Cl.
*G06F 3/045* (2006.01)
*G06F 3/044* (2006.01)
*G06F 3/041* (2006.01)
*H03K 17/96* (2006.01)

(52) U.S. Cl.
CPC .............. *G06F 3/044* (2013.01); *G06F 3/0418* (2013.01); *H03K 17/9622* (2013.01)

(58) Field of Classification Search
None
See application file for complete search history.

(56) References Cited

U.S. PATENT DOCUMENTS

| | | | |
|---|---|---|---|
| 7,652,538 B2 | 1/2010 | Choi | |
| 7,663,607 B2 | 2/2010 | Hotelling et al. | |
| 2007/0257890 A1 | 11/2007 | Hotelling et al. | |
| 2010/0110040 A1 | 5/2010 | Kim et al. | |
| 2011/0193817 A1 | 8/2011 | Byun et al. | |
| 2012/0049868 A1* | 3/2012 | Maharyta | 324/679 |

* cited by examiner

*Primary Examiner* — Nicholas Lee
(74) *Attorney, Agent, or Firm* — Harness, Dickey & Pierce, P.L.C.

(57) ABSTRACT

An operating method of a touch controller includes receiving a plurality of currents through a plurality of channels, respectively, sensing a first current among the plurality of currents and extracting the sensed first current as a first control current and converting a charge corresponding to a difference between the first control current and a second current among the plurality of currents into an output voltage.

22 Claims, 17 Drawing Sheets

TOUCH CONTROLLERS, METHODS THEREOF, AND DEVICES HAVING THE TOUCH CONTROLLERS

CROSS-REFERENCE TO RELATED APPLICATIONS

This application claims priority to U.S. provisional patent application No. 61/532,697 filed on Sep. 9, 2011 and, under 35 U.S.C. §119 (a), to Korean Patent Application No. 10-2012-0051060 filed on May 14, 2012, the entire contents of each of which are hereby incorporated by reference in its entirety.

BACKGROUND

Example embodiments of inventive concepts relate to a touch controller, and more particularly, to a touch controller for removing a display noise in a display common electrode, an operating method thereof and devices having the touch controller.

Demands for a touchable electronic device are increasing. The touchable electronic device includes a touch display panel for sensing a touch. The touch display panel includes a sensor electrode for measuring changes of a capacitance.

Capacitive sensing senses a touch by using a change of capacitance. When a finger or conductive stylus accesses a sensor electrode, the capacitance changes. A change of the capacitance may be measured by the sensor electrode, and the change of the capacitance may be converted into a location of X and Y.

The touch display panel includes a display common electrode to display an image. As thickness of the touch display panel gets thinner, a display noise generated in a display common electrode may affect touch sensing. The display noise may be generated by the material, structure of the display common electrode or a displayed image.

SUMMARY

An example embodiment is directed to an operating method of a touch controller, including receiving each of a plurality of currents through each of a plurality of channels, sensing a first current among the plurality of currents and extracting the sensed first current as a first control current, and converting a charge corresponding to difference between the first control current and a second current among the plurality of currents into an output voltage.

According to an example embodiment, an operating method of the touch controller may further include selecting the respective channel of the first current and the respective channel of the second current in response to a selection signal.

The converting into the output voltage includes converting current difference between the second current and the first control current into the output voltage.

According to an example embodiment, the operating method of the touch controller may further include compensating for a mismatch between a plurality of parasitic elements between a display common electrode and a sensor electrode in response to the output voltage.

The compensating for the mismatch between the plurality of parasitic elements includes comparing the output voltage with a comparison voltage and outputting a plurality of selection bits according to a comparison result, and compensating the mismatch by selecting at least one of a plurality of capacitors according to the plurality of selection bits and compensating for the mismatch based on the selected at least one capacitor.

According to an example embodiment, the converting and extracting the sensed second current as a second control current, and converting current difference between the second control current and the first control current as the output voltage.

An example embodiment of inventive concepts is directed to a touch controller, including a plurality of pins each connected to each of a plurality of channels, a selector for selecting two channels among the plurality of channels in response to a selection signal, and a differential sensing block configured to convert a charge corresponding to difference between a first current and a second current floating in each of the two channels into an output voltage.

The differential sensing block includes a current conveyer configured to sense the first current and extract the sensed first current as a control current, and a charge amplifier configured to convert current difference between the second current and the control current into the output voltage.

The current conveyer includes a first input terminal configured to receive the first current, a second input terminal configured to receive an alternating voltage, and a unity gain buffer amplifier including a first output terminal connected to the first input terminal, and a current copy circuit including a second output terminal, the current copy circuit for extracting the control current according to a plurality of control voltages output from the unity gain buffer amplifier.

The current copy circuit includes a sourcing circuit and a sinking circuit connected in series between a power node and a ground node of the unity gain buffer amplifier.

Each of the sourcing circuit and the sinking circuit is controlled by the plurality of control voltages. The control current is a current difference between a current flowing in the sinking circuit and a current flowing in the sourcing circuit. When a plurality of sensors connected to the plurality of channels is not touched, the output voltage is a reference voltage.

According to an example embodiment, the touch controller may further include a mismatch compensation block connected to a display common electrode, the mismatch compensation block configured to compensate for a mismatch between a plurality of parasitic elements between a display common electrode and a sensor electrode in response to the output voltage. The mismatch compensation block includes a capacitor array including a plurality of capacitors, and a selection bit generator configured to compare the output voltage with a comparison voltage to select at least one of the plurality of capacitors and generate a plurality of selection bits according to a comparison result.

The selection bit generator includes a comparator configured to compare the comparison voltage with the output voltage and output a comparison signal, and a SAR control logic configured to generate the plurality of selection bits in response to the comparison signal. The SAR control logic generates a compensation clock signal and supplies the compensation clock signal to a source driver.

Still another example embodiment of inventive concepts is directed to a touch controller, including a plurality of pins each connected to a plurality of channels, a first current conveyer configured to sense a first current flowing in one of the plurality of channels and extract the sensed first current as a first control current, a second current conveyer configured to sense a second current flowing in another channel among the plurality of channels and extract the sensed second current as a second control current, and a charge amplifier configured to convert current difference between the first control current and the second control current into an output voltage.

According to an example embodiment, the touch controller may further include a plurality of driving pins connected to the plurality of driving channels, and an integrated circuit configured to supply a sign pulse signal to each of the plurality of driving channels.

The first current conveyer includes an inverting input terminal configured to receive the first current, a non-inverting input terminal configured to receive a reference voltage, a unity gain buffer amplifier including an output terminal connected to the inverting terminal, and a current copy circuit configured to extract the first control current according to a plurality of control voltages output from the unity gain buffer amplifier.

The current copy circuit includes a sourcing circuit and a sinking circuit connected in series between a power node and a ground node of the unity gain buffer amplifier. Each of the sourcing circuit and the sinking circuit is configured to operate based on the plurality of control voltages.

The second current conveyer includes a unity gain buffer amplifier including an inverting input terminal configured to receive the second current, a non-inverting input terminal configured to receive a reference voltage and an output terminal connected to the inverting terminal, and a current copy circuit configured to extract the second control current according to a plurality of control voltages output from the unity gain buffer amplifier.

The current copy circuit includes a plurality of current mirrors each connected between a power node and a ground node of the unity gain buffer amplifier. Each of the plurality of current minors is configured to operate based on the plurality of control voltages.

An example embodiment of inventive concepts is directed to a touch display system, including a touch display panel and a touch controller connected to the touch display panel by a plurality of channels.

The touch controller includes a current conveyer sensing a first current among a plurality of currents flowing through each of the plurality of channels and extracting the sensed first current as a control current, and a charge amplifier converting difference between the control current and a second current among the plurality of currents into an output voltage. The touch display system is a portable device.

Another example embodiment discloses a touch display system including a display panel configured to produce a plurality of currents through a plurality of channels, respectively, an integrated circuit coupled to the plurality of channels, the integrated circuit including a differential sensor configured to receive a first current associated with a first channel and a second current associated with a second channel, generate a charge corresponding to a difference between the first and second currents, and convert the charge into an output voltage.

The integrated circuit further includes a mismatch compensator configured to compensate for parasitic capacitances in the display panel based on the output voltage.

The mismatch compensator includes a bit selection generator configured to receive the output voltage, compare the output voltage to a comparison voltage and generate a plurality of selection bits based on the comparison and a capacitor array configured to select at least one of a plurality of capacitors based on the plurality of selection bits to compensate for the parasitic capacitances.

The mismatch compensator is configured to selectively change a capacitance between a sensor electrode and a display common electrode to compensate for parasitic capacitances in the display panel.

The first and second channels are adjacent.

BRIEF DESCRIPTION OF THE DRAWINGS

The above and other features and advantages will become more apparent by describing in detail example embodiments thereof with reference to the attached drawings in which.

DETAILED DESCRIPTION

Figure 1:
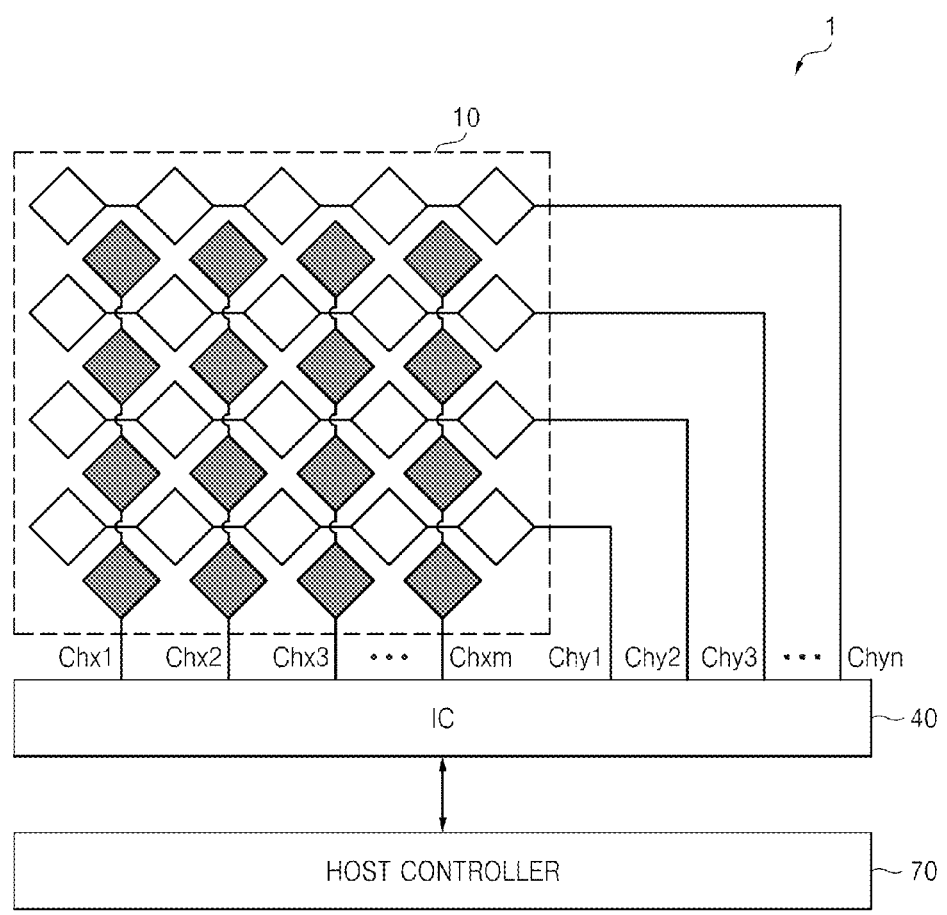
FIG. 1 is a plan view of a touch display system including a touch controller according to an example embodiment of inventive concepts.

Example embodiments now will be described more fully hereinafter with reference to the accompanying drawings, in which example embodiments are shown. Example embodiments may, however, be embodied in many different forms and should not be construed as limited to example embodiments set forth herein. Rather, example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises," "comprising," "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a plan view of a touch display system including a touch controller according to an example embodiment of inventive concepts. Referring to FIG. 1, a touch display system 1 is a portable device such as a smart phone, a cellular phone, a tablet PC, a laptop computer or a MP3 player. The touch display system 1 includes a touch display panel 10, an integrated circuit 40 and a host controller 70.

A plurality of sensors are arranged in a matrix of line and row in the touch display panel 10. Sensors of each line and sensors of each row are connected to each of a plurality of channels Chx1 to Chxm and Chy1 to Chyn, where m and n are natural numbers.

Figure 2:
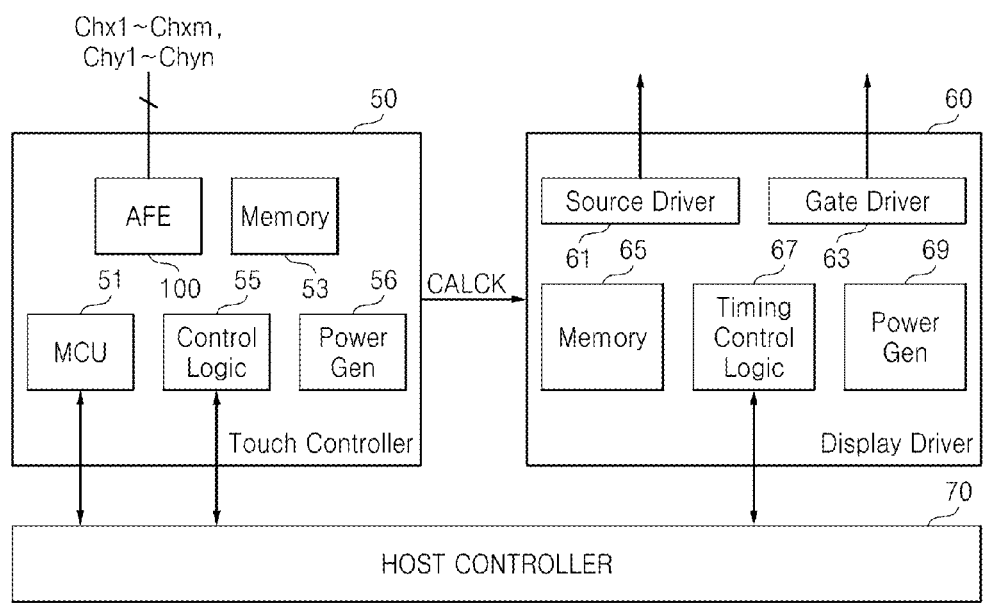
FIG. 2 is a block diagram of an integrated circuit illustrated in FIG. 1.

FIG. 2 is a block diagram of the integrated circuit illustrated in FIG. 1. Referring to FIGS. 1 and 2, the integrated circuit 40 includes a touch controller 50 and a display driver 60.

The touch controller 50 includes an analog front end (AFE) 100, a memory 53, a micro control unit (MCU) 51 and a control logic block 55.

The AFE 100 is connected to a plurality of channels Chx1 to Chxm and Chy1 to Chyn and receives each current through the plurality of channels Chx1 to Chxm and Chy1 to Chyn. The AFE 100 processes the each current and outputs a digital signal. The memory 53 stores a digital signal output from the AFE 100 or a digital signal processed by the MCU 51.

The MCU 51 processes a digital signal output from the AFE 100. For example, the MCU 51 calculates a touch coordinates based on a digital signal output from the AFE 100 and transmits the touch coordinates to the host controller 70. The MCU 51 and the control logic block 55 may communicate with the host controller 70. The control logic block 55 may receive timing control signals (e.g., a horizontal synchronization signal and a vertical synchronization signal) from a timing control logic block 67 through the host controller 70.

The display driver 60 includes a source driver 61, a gate driver 63, a memory 65, the timing control logic block 67 and a power generator 69.

The source driver 61 generates gray-scale data for driving a display panel in response to a control signal output from the timing control logic block 67. According to an example embodiment, the source driver 61 may be supplied with a compensation clock signal CALCK from the touch controller 50. The gate driver 63 scans gate lines of a display panel successively in response to a control signal output from the timing control logic block 67. The memory 65 stores display data.

The timing control logic block 67 generates timing control signals (e.g., a horizontal synchronization signal and a vertical synchronization signal) for controlling the source driver 61 and the gate driver 63. The timing control logic block 67 may communicate with the host controller 70. The power generator 69 generates power in response to timing control signals output from the timing control logic block 67.

Figure 3:
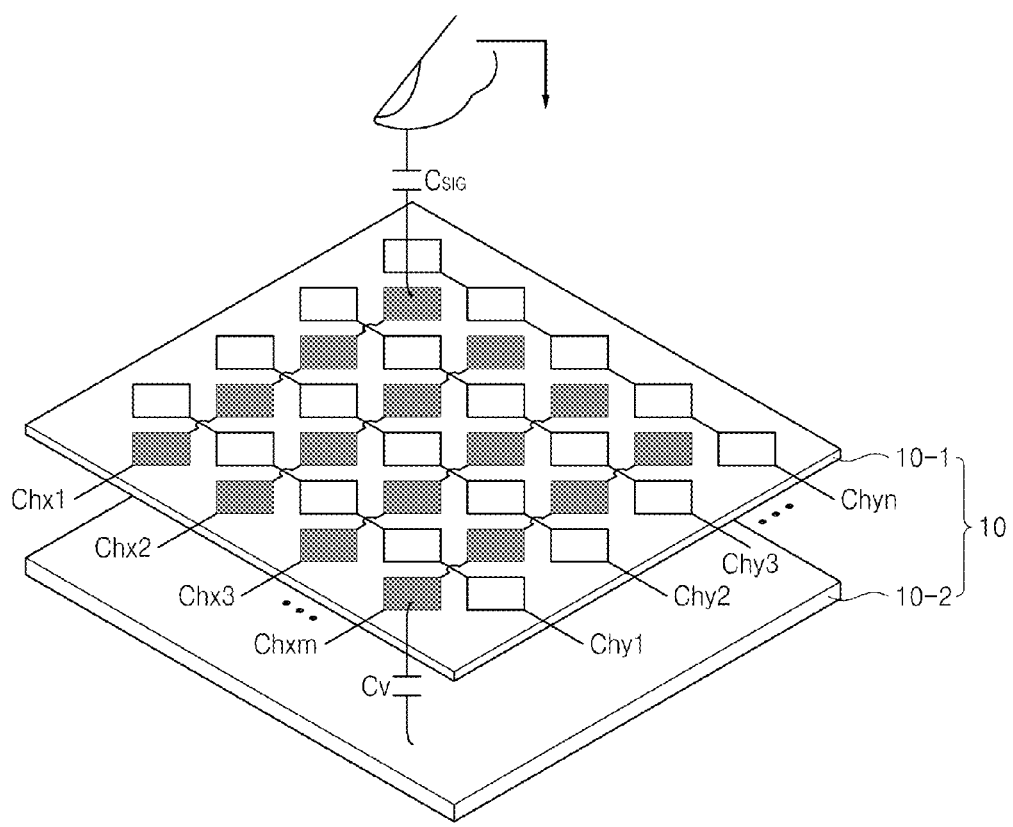
FIG. 3 is a cross-sectional diagram of a touch display panel illustrated in FIG. 1.

FIG. 3 is a cross-sectional diagram of the touch display panel illustrated in FIG. 1. Referring to FIGS. 1 to 3, the touch display panel 10 includes a sensor electrode 10-1 and a display common electrode 10-2.

The sensor electrode 10-1 may be embodied in an Indium Tin Oxide (ITO). The sensor electrode 10-1 includes a plurality of sensors.

When a man touches at least one of the plurality of sensors, capacitance CSIG is generated between the sensor electrode 10-1 and a finger of the man. A touch may be sensed by using the capacitance CSIG. That is, a current output from the sensor electrode 10-1 senses the capacitance CSIG. Such a type of capacitive sensing is self-capacitance sensing.

A vertical parasitic element Cv is formed between the sensor electrode 10-1 and the display common electrode 10-2. According to an example embodiment, the vertical parasitic element Cv may be called parasitic capacitance, a vertical parasitic element, or vertical parasitic capacitance.

As the touch display panel 10 gets thinner or the touch display panel 10 gets bigger, the parasitic element Cv gets bigger. As the parasitic element Cv gets bigger, a display noise may affect touch sensing more. Accordingly, a method of removing the display noise is required. The display noise may be generated by a material or a structure of the display common electrode 10-2, or an image to be displayed.

Figure 4:
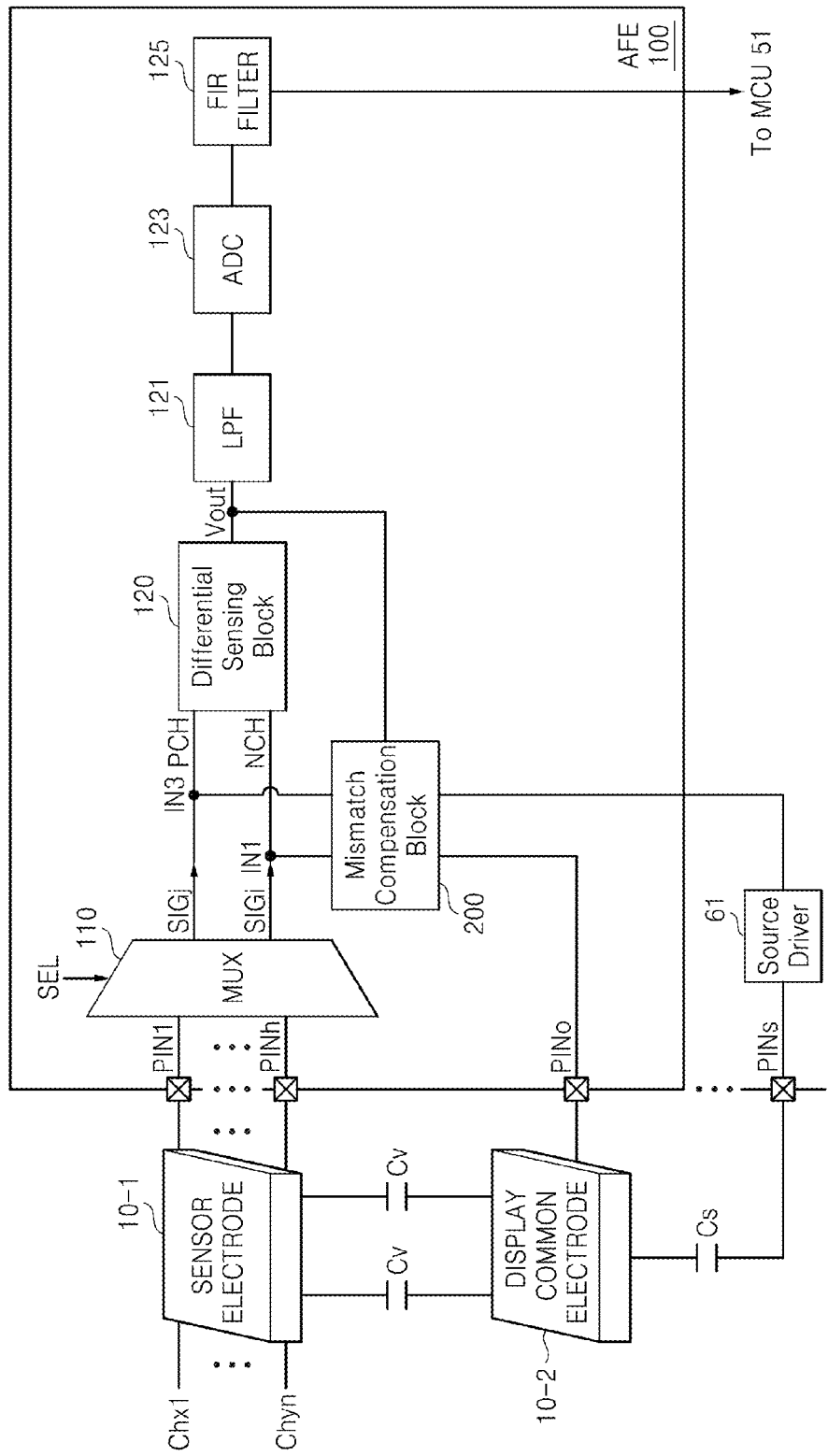
FIG. 4 is a block diagram of an analog front end illustrated in FIG. 3.

FIG. 4 is a block diagram of the analog front end illustrated in FIG. 2. Referring to FIGS. 1 to 4, the AFE 100 includes a plurality of pins PIN1 to PINh, where h is a natural number, a selector 110, a differential sensing block 120, a low pass filter (LPF) 121, an analog to digital converter (ADC) 123 and a finite impulse response (FIR) filter 125.

Each of the plurality of pins PIN1 to PINh is connected to each of a plurality of channels Chx1 to Chxm and Chy1 to Chyn. A plurality of channels, e.g., Chx1 to Chxm, are row-related channels and a plurality of channels, e.g., Chy1 to Chyn, are column-related channels.

The selector 110 selects two channels among a plurality of channels Chx1 to Chxm and Chy1 to Chyn in response to a selection signal SEL. For example, the selector 110 may select two channels PCH and NCH among the plurality of channels Chx1 to Chxm and Chy1 to Chyn in an order of (Chx1, Chx2), (Chx2, Chx3), (Chx3, Chxm), (Chy1, Chy2), (Chy2, Chy3), and (Chy3, Chyn). According to an example embodiment, the selector 110 may select two channels PCH and NCH among the plurality of channels Chx1 to Chxm and Chy1 to Chyn in an order of (Chx1, Chx2), (Chx1, Chx3), (Chx1, Chxm), (Chy1, Chy2), (Chy1, Chy3), and (Chy1, Chyn).

The differential sensing block 120 converts a charge, which corresponds to difference between a first current SIGi and a second current SIGj flowing in each of two channels NCH and PCH, into an output voltage Vout and outputs the output voltage Vout. The differential sensing block 120 may remove a display noise occurred in a display common electrode 10-2 by differentially sensing two of a plurality of channels NCH and PCH. A detailed operation of the differential sensing block 120 will be explained in detail in FIGS. 5 and 6.

A LPF 121 decreases a noise element in an output voltage Vout. The ADC 123 converts an output voltage which is an analog signal into a digital signal. A FIR filter 125 is used to remove a noise of the digital signal.

Figure 5:
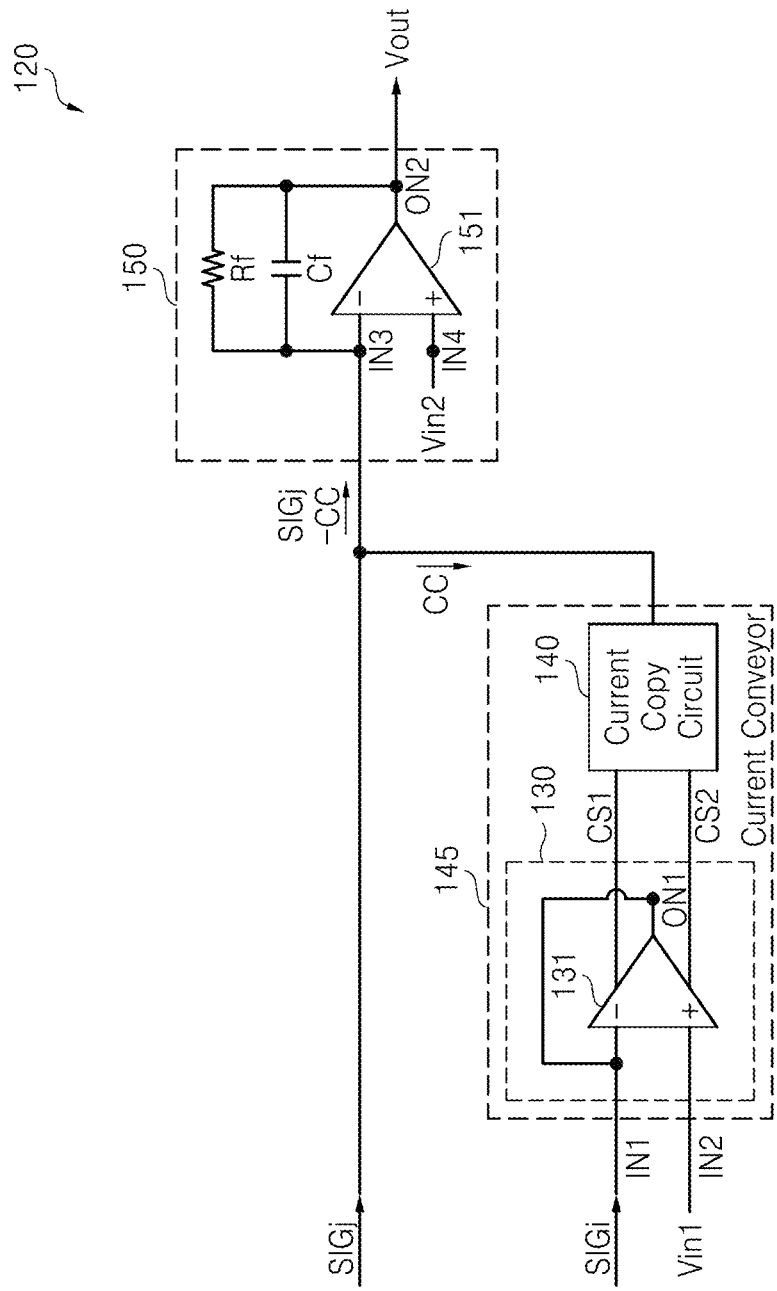
FIG. 5 is a block diagram of a differential sensing block illustrated in FIG. 4.

FIG. 5 is a block diagram of the differential sensing block illustrated in FIG. 4. Referring to FIGS. 4 and 5, the differential sensing block 120 includes a current conveyor 145 and a charge amplifier 150.

The current conveyer 145 senses a first current SIGi and extracts a sensed first current SIGi as a control current CC. The current conveyer 145 may include a unity gain buffer amplifier 130 and a current copy circuit 140.

The unity gain buffer amplifier 130 includes an operational amplifier 131. The operational amplifier 131 includes a first input terminal IN1 receiving a first current SIGi, a second input terminal IN2 receiving a first alternating voltage Vin1, and a first output terminal ON1 connected to the first input terminal IN1. The first input terminal IN1 is an inverting terminal and the second input terminal IN2 is a non-inverting terminal.

The first input terminal IN1 and the second input terminal IN2 have the same voltage as each other according to characteristics of the unity gain buffer amplifier 130. That is, when a first alternating voltage Vin1 is applied to the second input terminal IN2, a first alternating voltage Vin1 is applied to the first input terminal IN1. A first current SIGi is generated by the first alternating voltage Vin1. The first alternating voltage Vin1 may be supplied by a voltage generator (not shown). When a man's finger or conductive stylus touches the touch display panel 10, the first current SIGi senses capacitance CSIG, a parasitic element Cv, and a display noise.

The unity gain buffer amplifier 130 may also be called a voltage follower because a voltage output from a first output terminal ON1 follows a voltage of the first input terminal IN1.

Figure 6:
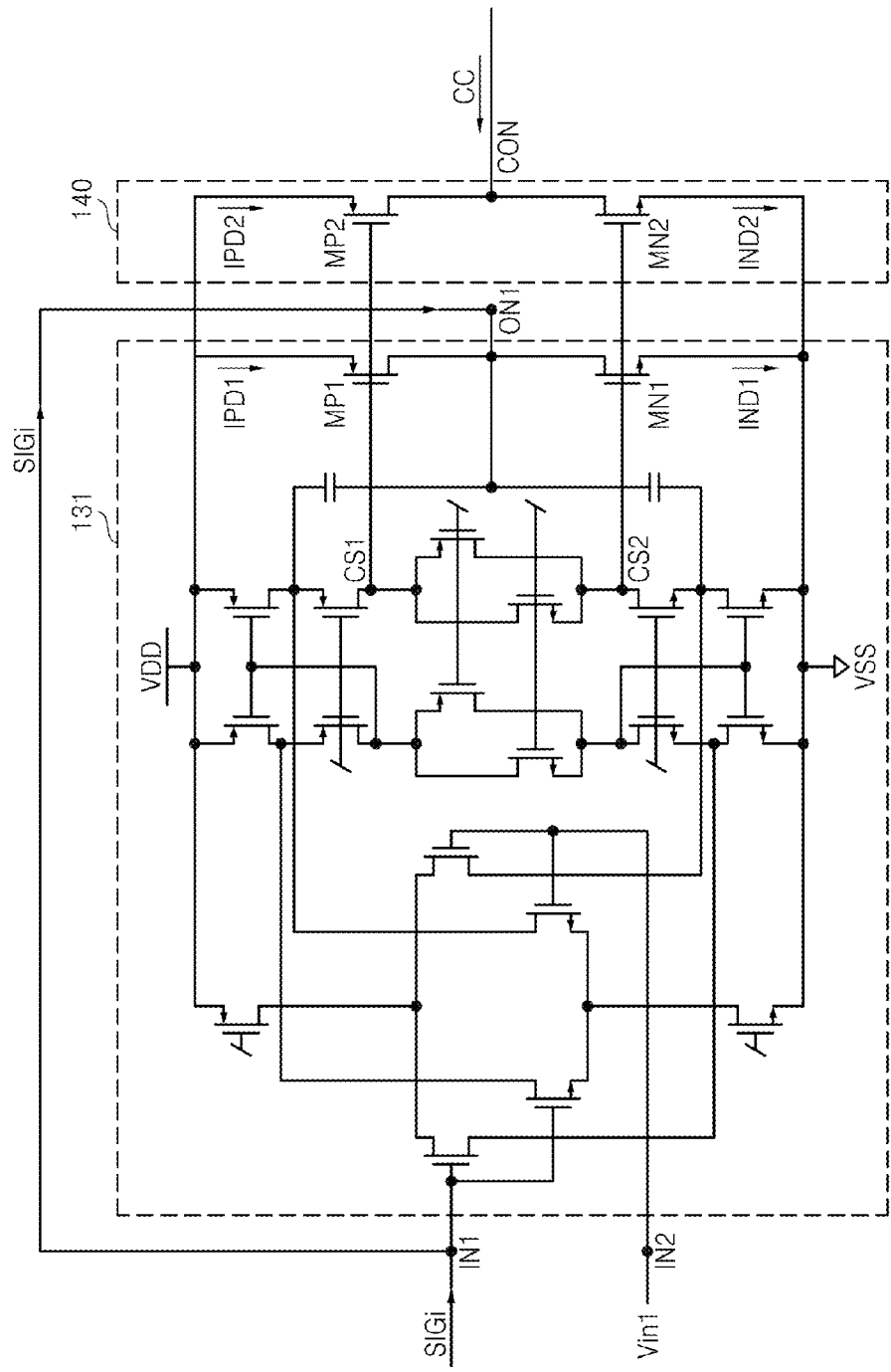
FIG. 6 is a circuit diagram of a current conveyer illustrated in FIG. 5.

FIG. 6 is a circuit diagram of the current conveyer illustrated in FIG. 5. Referring to FIGS. 5 and 6, the current conveyer 145 includes the unity gain buffer amplifier 130 and the current copy circuit 140. The unity gain buffer amplifier 130 includes an operational amplifier 131. The operational amplifier 131 is explained in detail in FIG. 1 of a U.S. Pat. No. 7,652,538, entitled "CIRCUIT AND METHODS FOR IMPROVING SLEW RATE OF DIFFERENTIAL AMPLIFIER," the entire contents of which are hereby incorporated by reference, so that explanation for this is omitted.

The current copy circuit 140 generates a control current CC according to a plurality of control voltages CS1 and CS2 output from the operational amplifier 131. The current copy circuit 140 includes a sourcing circuit MP2 and a sinking circuit MN2 connected in series between a power node VDD and a ground node VSS. The source circuit MP2 may be embodied in a PMOS transistor and the sinking circuit MN2 may be embodied in a NMOS transistor.

Each size (length and width) of a plurality of transistors MP1, MP2, MN1 and MN2 is the same. A first transistor MP1 and a third transistor MP2 are controlled by a first control voltage CS1, and a second transistor MN1 and a fourth transistor MN2 are controlled by a second control voltage CS2.

Accordingly, a current IPD1 flowing in the first transistor MP1 is the same as a current IPD2 flowing in the third transistor MP2, and a current IND1 flowing in the second transistor MN1 is the same as a current IND2 flowing in the fourth transistor MN2.

A current SIGi flowing from the first input terminal IN1 to the first output terminal ON1 is the same as difference between the current IPD1 flowing in the first transistor MP1 and the current IND1 flowing in the second transistor MN1. It can be expressed as shown in equation 1.

$$SIGi = IND1 - IPD1 \qquad \text{[Equation 1]}$$

A control current CC is the same as difference between a current IPD2 flowing in the third transistor MP2 and a current IND2 flowing in the fourth transistor MN2. It may be expressed as shown in equation 2.

$$CC = IND2 - IPD2 \qquad \text{[Equation 2]}$$

By adding the third transistor MP2 and the fourth transistor MN2 and sensing the first current SIGi, the sensed first current SIGi is extracted from a node CON as a control current CC.

Referring to FIG. 5, the charge amplifier 150 includes an operational amplifier, e.g., 151. The operational amplifier 151 includes a third input terminal IN3 receiving a current difference (SIGj–CC) between the second current SIGj and the control current CC, a fourth input terminal IN4 receiving a second alternating voltage Vin2, and a second output terminal ON2. In addition, the charge amplifier 150 includes feedback resistance Rf and a feedback capacitor Cf connected in parallel between the third input terminal IN3 and the second output terminal ON2.

The charge amplifier 150 transmits a charge corresponding to a current difference (SIGj–CC) between the second current SIGj and the control current CC to the feedback capacitor Cf, and generates an output voltage Vout corresponding to a voltage passing through the feedback capacitor Cf. The charge amplifier 150 may be called a charge to voltage converter.

When the touch display panel 10 is not touched, an ideal output voltage Vout is a reference voltage. For example, the reference voltage may be 0V. However, there may be mismatch between a plurality of parasitic elements Cv according to differences of manufacturing process. An output voltage Vout may not be a reference voltage. Accordingly, the AFE 100 may further include a mismatch compensation block 200 for compensating mismatch between the plurality of parasitic elements Cv. The mismatch compensation block 200 is connected to a pin PINo which is connected to the display common electrode 10-2.

Figure 7:
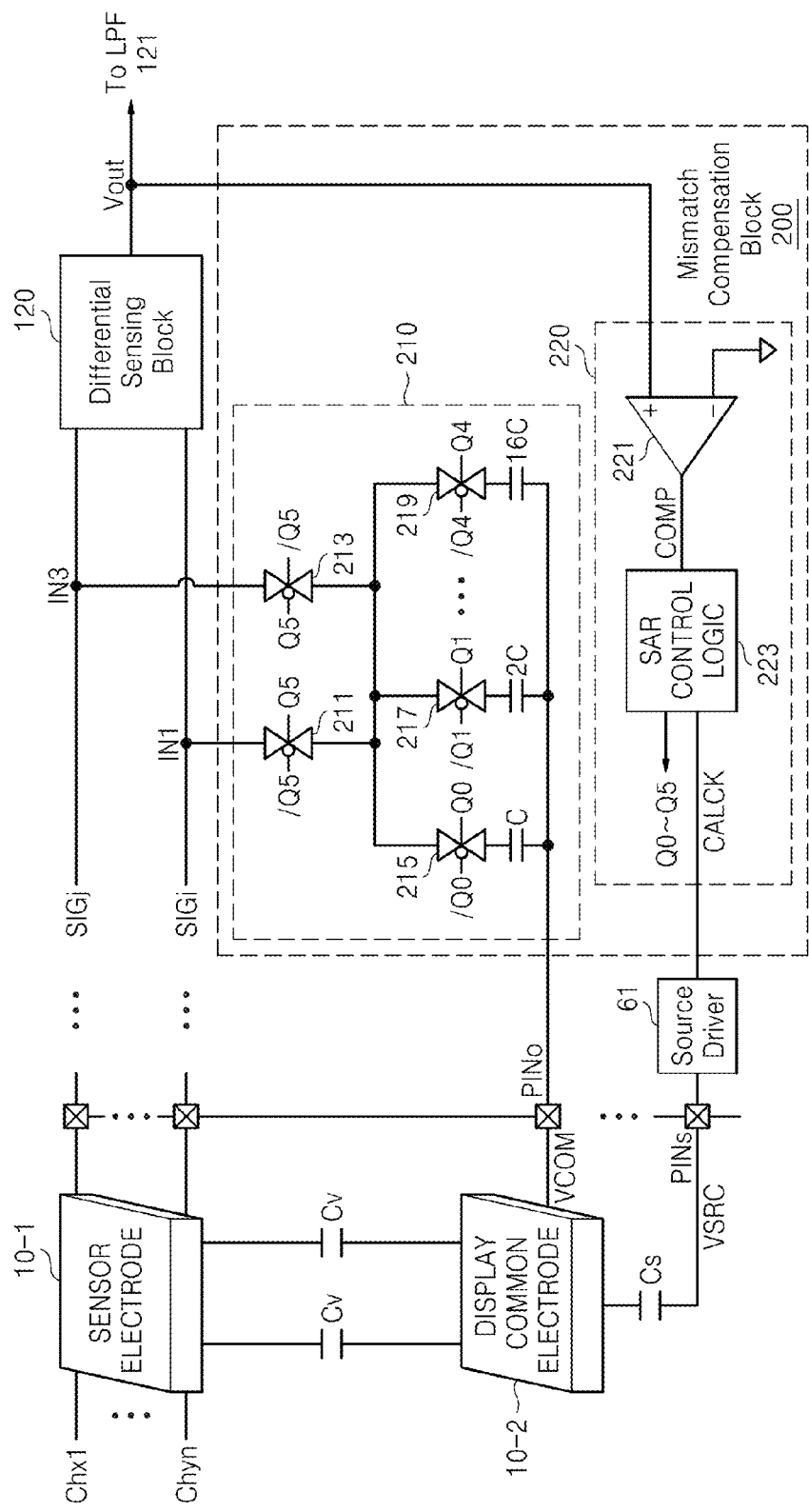
FIG. 7 is a block diagram of a mismatch compensation block illustrated in FIG. 4.

FIG. 7 is a block diagram of the mismatch compensation block illustrated in FIG. 4. Referring to FIGS. 4, 5 and 7, the mismatch compensation block 200 includes a capacitor array 210 and a selection bit generator 220.

The capacitor array 210 is connected to the first input terminal IN1 and the third input terminal IN3, and connected to a pin PINo which is connected to the display common electrode 10-2. The capacitor array 210 includes a plurality of capacitors C, 2C, ... and 16C and a plurality of switches 211, 213, 215, 217 and 219. Capacitance of each of the plurality of capacitors C, 2C, ..., and 16C is different from one another. Each of the plurality of switches 211, 213, 215, 217 and 219 may be embodied in a transmission gate. According to an example embodiment, the number of the plurality of capacitors C, 2C, ..., and 16C and the number of the plurality of switches 211, 213, 215, 217 and 219 can vary.

The selection bit generator 220 compares an output voltage Vout with a comparison voltage and outputs a plurality of selection bits, e.g., Q0 to Q5, according to a comparison result to select at least one of the plurality of capacitors C, 2C, . . . and 16C.

The selection bit generator 220 includes a comparator 221 and a successive approximation register (SAR) control logic 223. The comparator 221 includes a first input terminal receiving the comparison voltage, a second input terminal receiving the output voltage Vout, and an output terminal outputting a comparison signal COMP. For example, the comparison voltage is a ground voltage.

When the output voltage Vout is greater than the comparison voltage, e.g., 0V, the comparator 221 outputs a comparison signal COMP having a high level. When the output voltage Vout is less than the comparison voltage, e.g., 0V, the comparator 221 outputs a comparison signal COMP having a low level.

The SAR control logic 223 sets one of a plurality of selection bits Q0 to Q5 in response to a comparison signal COMP, moves to a next bit and sets the next bit. A plurality of selection bits /Q0, /Q1, /Q2, /Q3, and /Q4 are inverting bits of the plurality of selection bits Q0, Q1, Q2, Q3 and Q4.

For example, a most significant bit Q5 among the plurality of selection bits Q0 to Q5 is set to '1' and the rest bits Q4 to Q0 are set to '0' at first. Accordingly, a switch 211 is turned on and the rest switches 213, 215, 217 and 219 are turned off.

When a comparison signal COMP is at a high level, the SAR control logic 223 keeps the most significant bit Q5 to be '1', and sets a next bit Q4 to '1'. Accordingly, switches 211 and 219 are turned on.

When a comparison signal COMP is at a low level, the SAR control logic 223 resets the most significant bit Q5 to '0' and sets a next bit Q4 to '1'. Accordingly, a switch 211 is turned off and switches 213 and 219 are turned on.

After a switch 219 and one of switches 211 and 213 are turned on, the differential sensing block 120 outputs an output voltage Vout by performing a differential sensing operation on a first current SIGi and a second current SIGj. The comparator 221 compares the output voltage Vout with the comparison voltage and performs a comparison operation outputting a comparison signal COMP. The SAR control logic 223 sets a selection bit Q4 to '1' or '0' according to a comparison signal COMP, and performs a bit setting operation setting a next bit Q3 to '1'.

Until a least significant bit Q0 is decided, the differential sensing operation of the differential sensing block 120, the comparison operation of the comparator 221, and the bit setting operation of the SAR control logic 223 are performed repetitively. Accordingly, mismatch of a parasitic element may be compensated. The differential sensing operation of the differential sensing block 120, the comparison operation of the comparator 221, and the bit setting operation of the SAR control logic 223 may be defined as a mismatch compensation operation.

The SAR control logic 223 generates a compensation clock signal CALCK, and outputs the compensation clock signal CALCK to the source driver 61. The compensation clock signal CALCK may be generated in response to an internal compensation clock enable signal (not shown).

The source driver 61 supplies a source signal VRSC to the display common electrode 10-2 through a pin PINs in response to the compensation clock signal CALCK. A display voltage VCOM is supplied to the display common electrode 10-2 in response to a source signal VRSC. A mismatch compensation operation may be performed by supplying a display voltage VCOM to the display common electrode 10-2.

When a display voltage VCOM is supplied to the display common electrode 10-2, a first alternating voltage Vin1 and a second alternating voltage Vin2 illustrated in FIG. 5 may be a reference voltage.

Figure 8:
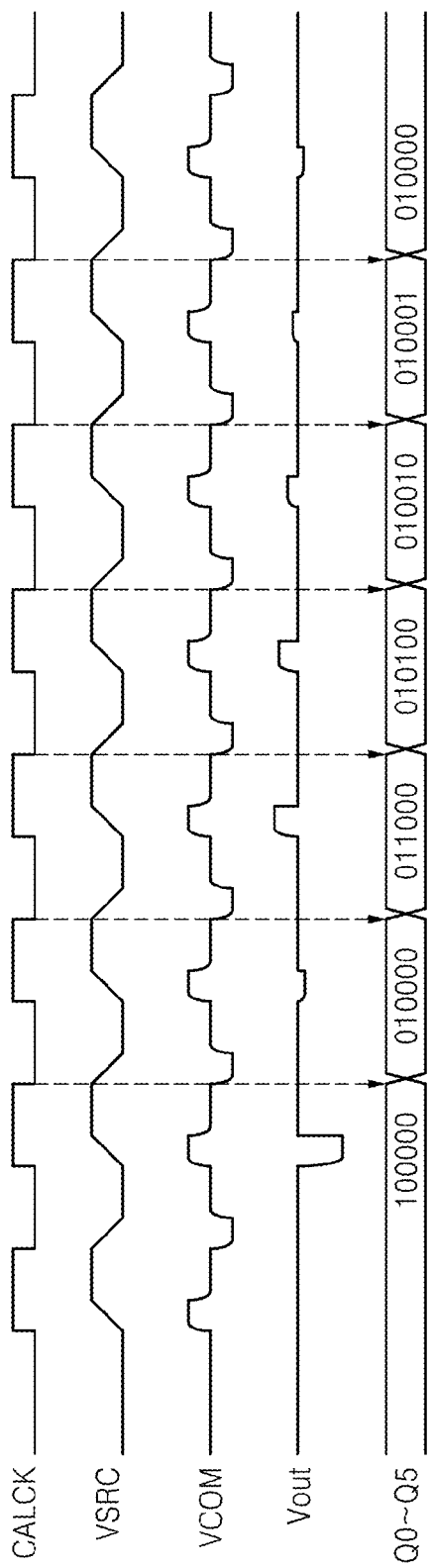
FIG. 8 is a timing diagram for explaining a mismatch compensation operation illustrated in FIG. 7.

FIG. 8 is a timing diagram for explaining the mismatching compensation operation illustrated in FIG. 7. Referring to FIGS. 4, 7 and 8, the SAR control logic 223 generates a compensation clock signal CALCK and outputs the compensation clock signal CALCK to the source driver 61.

The source driver 61 outputs a source signal VRSC to the display common electrode 10-2 in response to the compensation clock signal CALCK. The source signal VRSC has a slew by parasitic capacitance Cs formed between the source driver 61 and the display common electrode 10-2. A display voltage VCOM is supplied to the display common electrode 10-2 in response to the source signal VRSC.

The differential sensing block 120 outputs an output voltage Vout in response to a display voltage VCOM. When the touch display panel 10 is not touched, an ideal output voltage Vout is a reference voltage. By performing a mismatch compensation operation, the output voltage Vout may get close to a reference voltage.

By performing a mismatch compensation operation, each bit value of the plurality of selection bits Q0, Q1, Q2, Q3 and Q4 may change.

Figure 9:
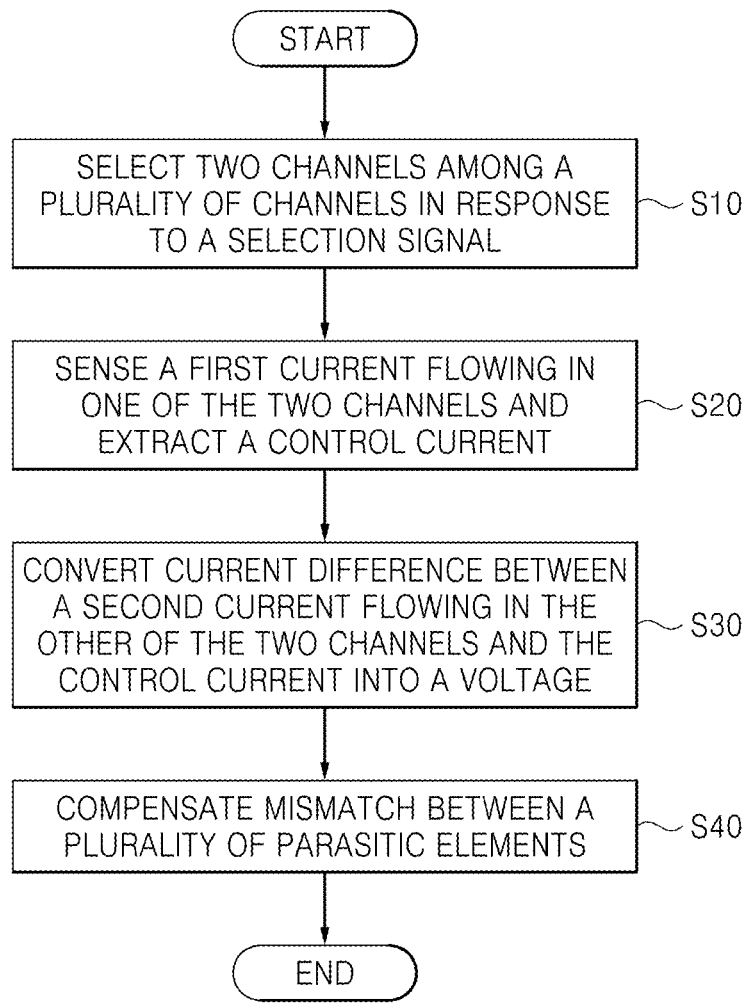
FIG. 9 is a flowchart for explaining an operating method of the analog front end illustrated in FIG. 4.

FIG. 9 is a flowchart for explaining an operation method of the analog front end illustrated in FIG. 4. Referring to FIGS. 4 to 9, the selector 110 selects two channels PCH and NCH among a plurality of channels Chx1 to Chxm, Chy1 to Chyn in response to a selection signal SEL (S10).

A first current SIGi and a second current SIGj flowing in each of the two channels NCH and PCH sense capacitance CSIG, a parasitic element Cv and a display noise.

The current conveyer 145 senses a first current SIGi and extracts a sensed first current SIGi as a control current CC (S20). The charge amplifier 150 transmits a charge corresponding to difference (SIGj–CC) between a second current SIGj and a control current CC to a feedback capacitor Cf, and generates an output voltage Vout corresponding to a voltage passing through the feedback capacitor Cf (S30). Accordingly, the display noise may be removed.

When the touch display panel 10 is not touched, an ideal output voltage Vout is a reference voltage. However, an output voltage Vout may be not a reference voltage because of mismatch between a plurality of parasitic elements Cv. Therefore, a mismatch compensation operation for compensating mismatch between the plurality of parasitic elements Cv may be more requested. A mismatch compensation block 200 compensates mismatch between the plurality of parasitic elements Vc (S40).

Figure 10:
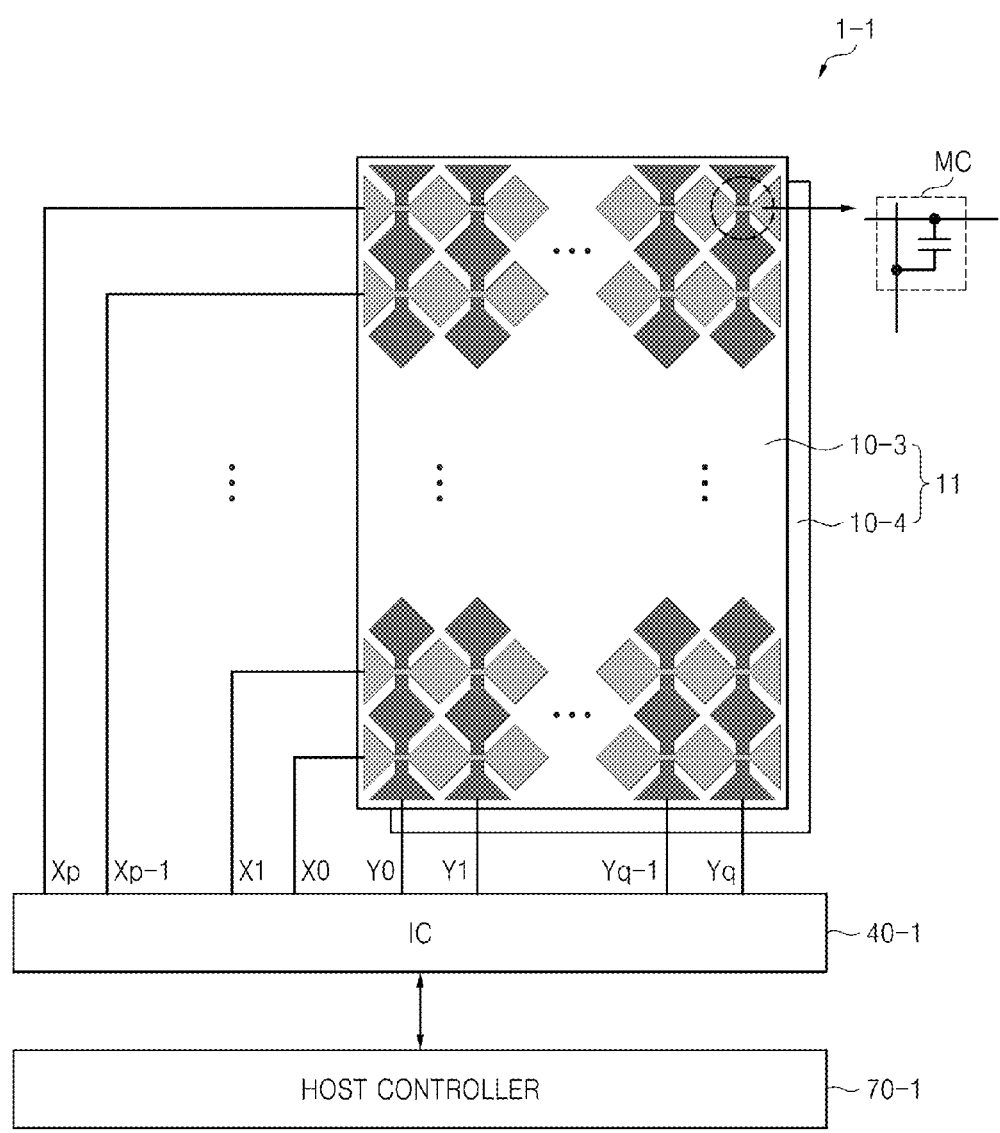
FIG. 10 is a plan view of a touch display system including the touch controller according to another example embodiment of inventive concepts.

FIG. 10 is a plan view of a touch display system including the touch controller according to another example embodiment of inventive concepts. Referring to FIG. 10, a touch display system 1-1 is a portable device like a smart phone, a cellular phone, a tablet PC, a laptop computer or a MP3 player. The touch display system 1-1 includes a touch display panel 11 and an integrated circuit 40-1. The touch display panel 11 includes a sensor electrode 10-3 and a display common electrode 10-4.

The sensor electrode 10-3 includes a plurality of sensors having a diamond pattern. Each of a plurality of driving channels X0 to Xp, where p is a natural number, is connected to a plurality of sensors which will be arranged in a row. According to an example embodiment, the plurality of driving channels X0 to Xp may be called a plurality of horizontal channels. A pulse signal from the IC 40-1 is supplied to each of the plurality of driving channels X0 to Xp. The pulse signal may be a sign pulse.

Each of a plurality of sensing channels Y0 to Yq, where q is a natural number, is connected to a plurality of sensors arranged in a column. According to an example embodiment, the plurality of sensing channels Y0 to Yq may be called a plurality of vertical channels. Each current is output through the plurality of sensing channels Y0 to Yq. A mutual capacitance node MC is formed at a crossing point of each of the plurality of driving channels and each of the plurality of sensing channels.

Figure 11:
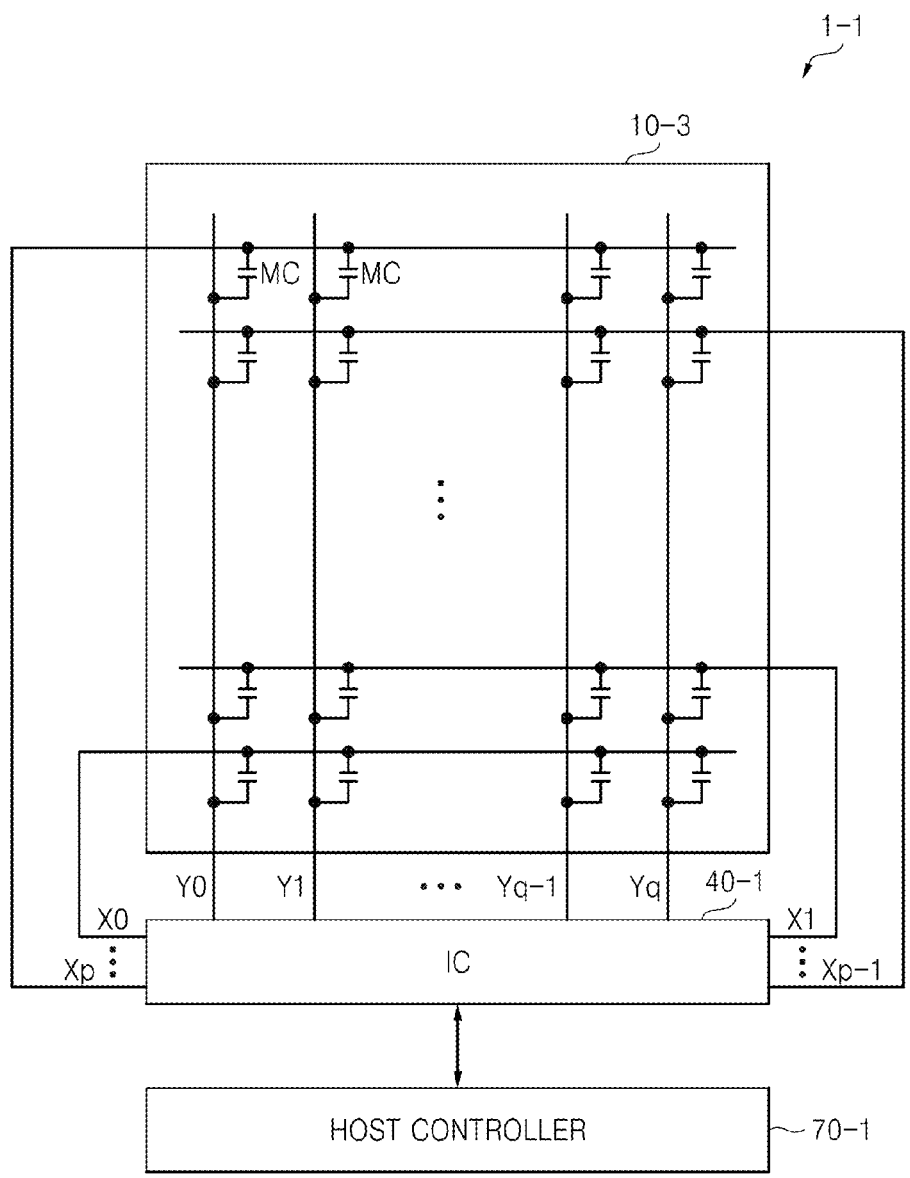
FIG. 11 is a block diagram of a touch display panel illustrated in FIG. 10.

FIG. 11 is a block diagram of the touch display panel illustrated in FIG. 10. Referring to FIGS. 10 and 11, when a finger or conductive stylus touches the sensor electrode 10-3, capacitance changes at the mutual capacitance node MC. Accordingly, the integrated circuit 40-1 may extract a touch coordinates according to changes of the capacitance. Such a type of conductive sensing is mutual capacitance sensing.

A parasitic element may be formed between the sensor electrode 10-3 and the display common electrode 10-4. The bigger the parasitic element gets, the more a display noise may affect touch sensing. Accordingly, a method of removing the display noise is necessary.

Figure 12:
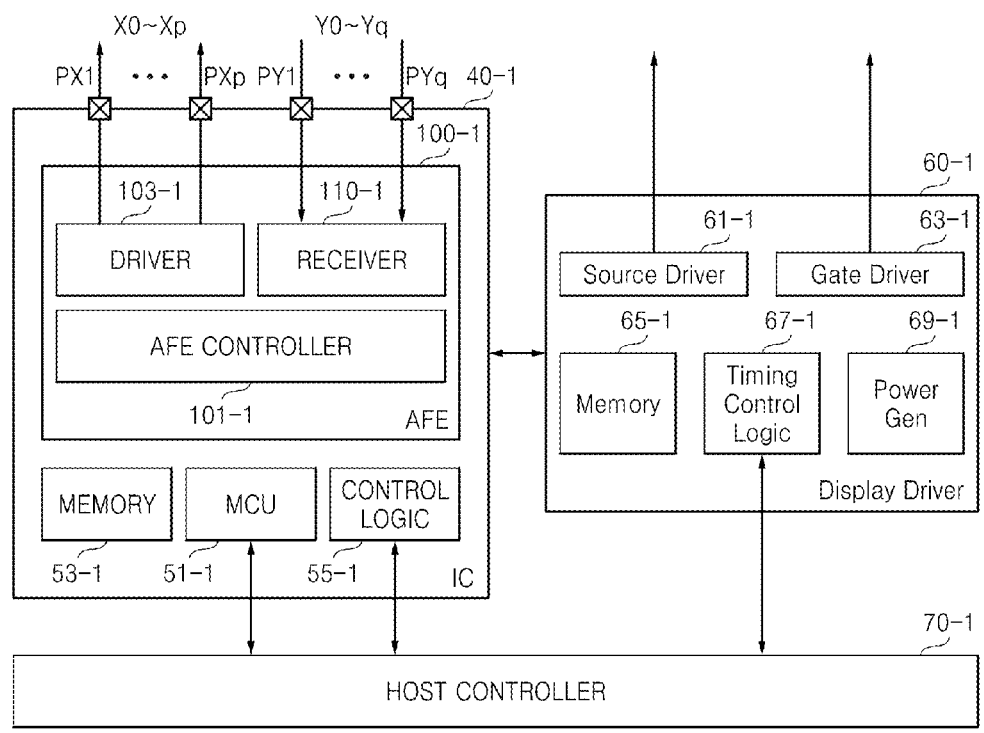
FIG. 12 is an example embodiment of a block diagram of an integrated circuit illustrated in FIG. 10.

FIG. 12 is a block diagram of the integrated circuit illustrated in FIG. 10. Referring to FIGS. 10 and 12, the integrated circuit 40-1 includes an AFE 100-1, a MCU 51-1, a memory 53-1 and a control logic block 55-1.

The AFE 100-1 includes an AFE controller 101-1, a driver 103-1 and a receiver 110-1. The driver 103-1 supplies a pulse signal, e.g., a voltage, to each of the plurality of driving channels X0 to Xp through a plurality of driving pins PX1 to PXp, where p is a natural number. An operation of the receiver 110-1 will be explained in detail in FIG. 12.

The AFE controller 101-1 controls the driver 103-1 or the receiver 110-1. For example, the AFE controller 101-1 may control the driver 103-1 to supply a pulse signal, e.g., a voltage, to each of the plurality of driving channels X0 to Xp.

The memory 53-1 stores a digital signal output from the AFE 100-1 or a digital signal processed by the MCU 51. The MCU 51-1 calculates a touch coordinates by using a digital signal output from the AFE 100-1, and transmits the touch coordinates to a host controller 50-1. The control logic block 55-1 may receive control signals, e.g., a horizontal synchronization signal and a vertical synchronization signal, for controlling a touch operation from a display driver 60-1.

The display driver 60-1 includes a source driver 61-1, a gate driver 63-1, a memory 65-1, a timing controller logic block 67-1 and a power generator 69-1.

Each component 61-1, 63-1, 65-1, 67-1 and 69-1 of the display driver 60-1 has an operation and a function similar to each component 61, 63, 65, 67 and 69 of the display driver 60 illustrated in FIG. 2, so that detailed explanation for this is omitted.

Figure 13:
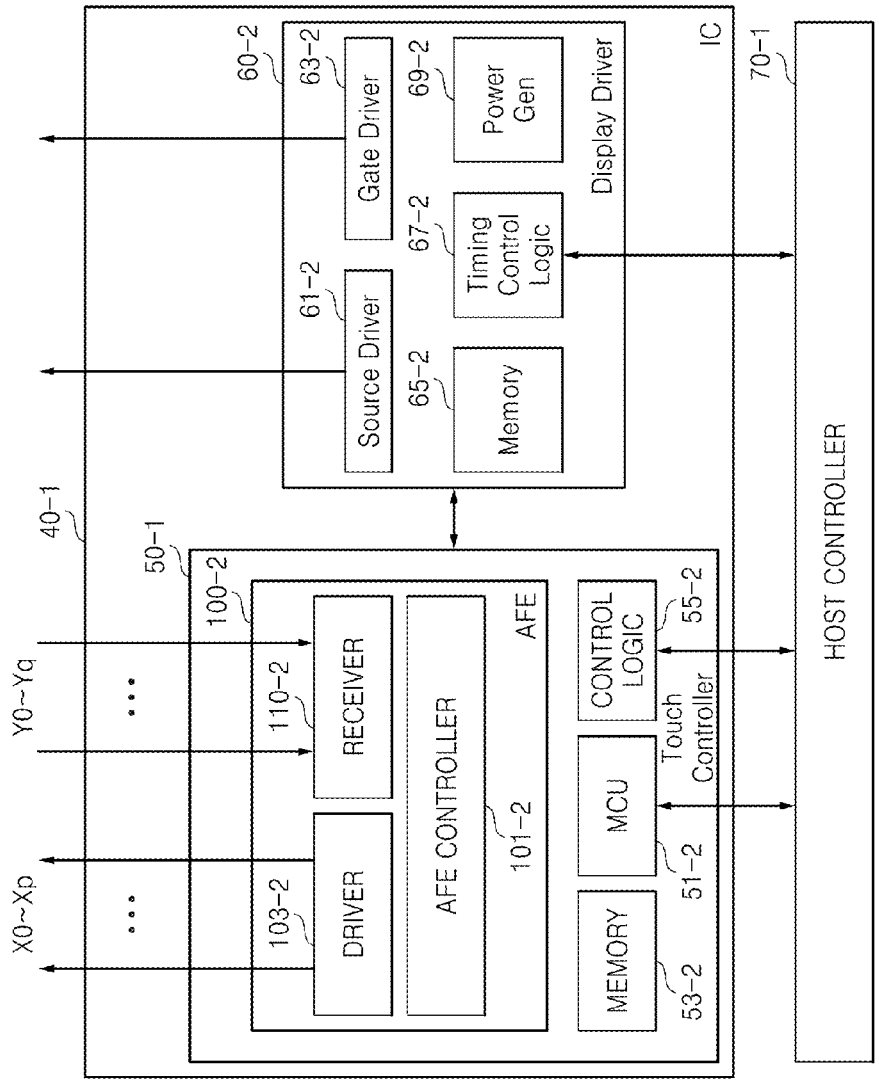
FIG. 13 is another example embodiment of the block diagram of the integrated circuit illustrated in FIG. 10.

FIG. 13 is another example embodiment of the block diagram of the integrated circuit illustrated in FIG. 10. Referring to FIGS. 10 and 13, an integrated circuit 40-1 may include a touch controller 50-1 and a display driver 60-2 according to an example embodiment. The touch controller 50-1 includes an AFE 100-2, a MCU 51-2, a memory 53-2, and a control logic block 55-2.

The AFE 100-2 includes the AFE controller 101-2, a driver 103-2, and a receiver 110-2. Each component 100-2, 51-2, 53-2, 55-2, 101-2, 103-2, or 110-2 has an operation and a function similar to each component 100-1, 51-1, 53-1, 55-1, 101-1, 103-1 or 110-1 illustrated in FIG. 12, so that detailed explanation for this is omitted.

The display driver 60-2 includes a source driver 61-2, a gate driver 63-2, a memory 65-2, a timing control logic block 67-2 and a power generator 69-2. Each component 61-2, 63-2, 65-2, 67-2, or 69-2 of the display driver 60-2 has an operation and a function similar to each component 61, 63, 65, 67 or 69 of the display driver 60 illustrated in FIG. 2, detailed explanation for this is omitted.

Figure 14:
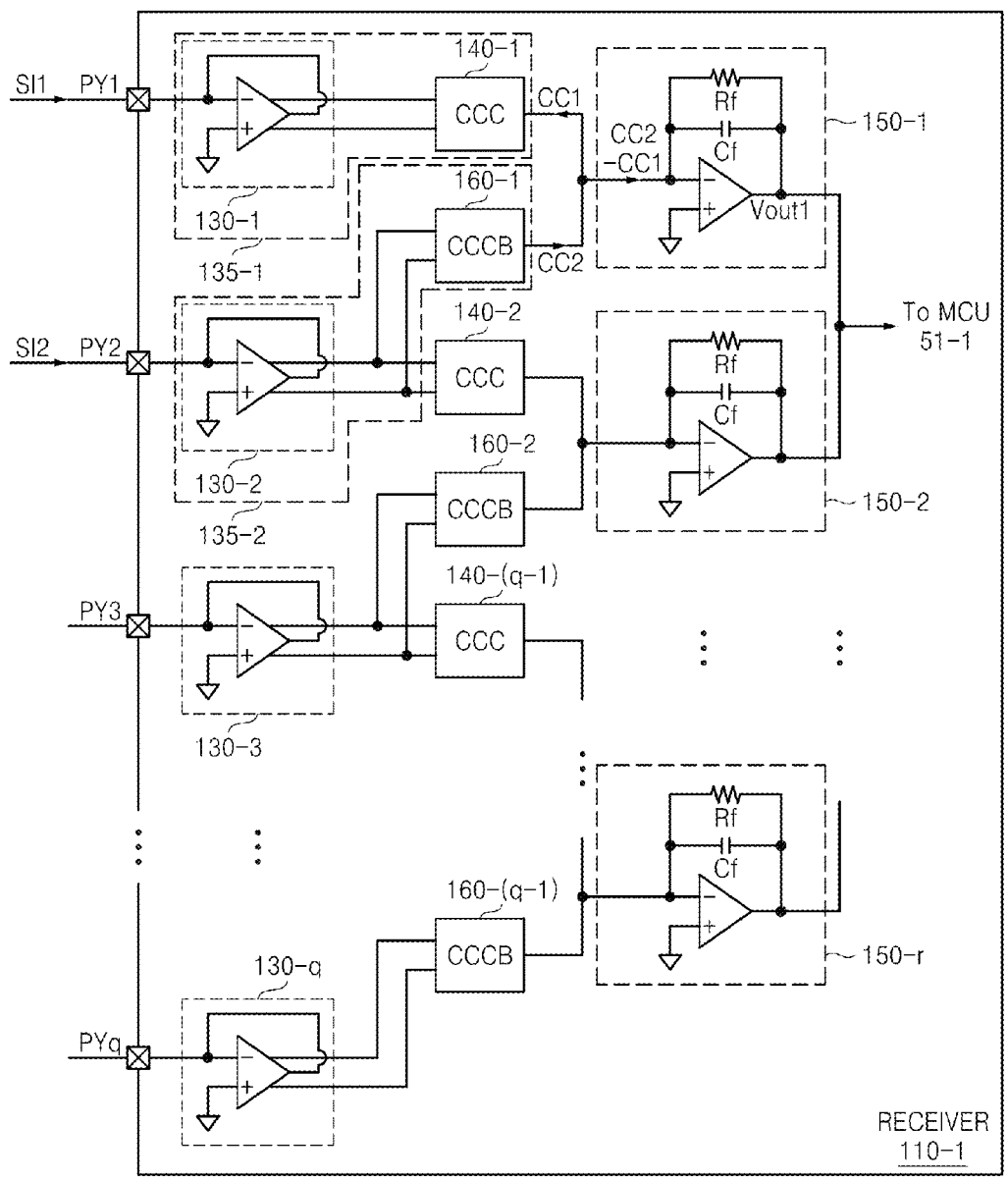
FIG. 14 is a block diagram of a receiver illustrated in FIG. 12.

FIG. 14 is a block diagram of the receiver illustrated in FIG. 12. Referring to FIGS. 12 and 14, the receiver 110-1 includes a plurality of pins PY1 to PYq, a plurality of unity gain buffer amplifiers 130-1, 130-2, . . . and 130-q, a plurality of first current copy circuits 140-1, 140-2, . . . and 140-(q-1), a plurality of second current copy circuits 160-1, 160-2, . . . and 160-(q-1), and a plurality of charge amplifiers 150-1, 150-2, . . . and 150-r, where r is a natural number.

Each of the plurality of pins PIN1 to PINh is connected to each of the plurality of sensing channels Y0 to Yq. A first current SI1 and a second current SI2 are received through the plurality of pins PIN1 to PINh. A first current conveyer 135-1 senses the first current SI1 and extracts a sensed first current SI1 as a first control current CC1.

Figure 15:
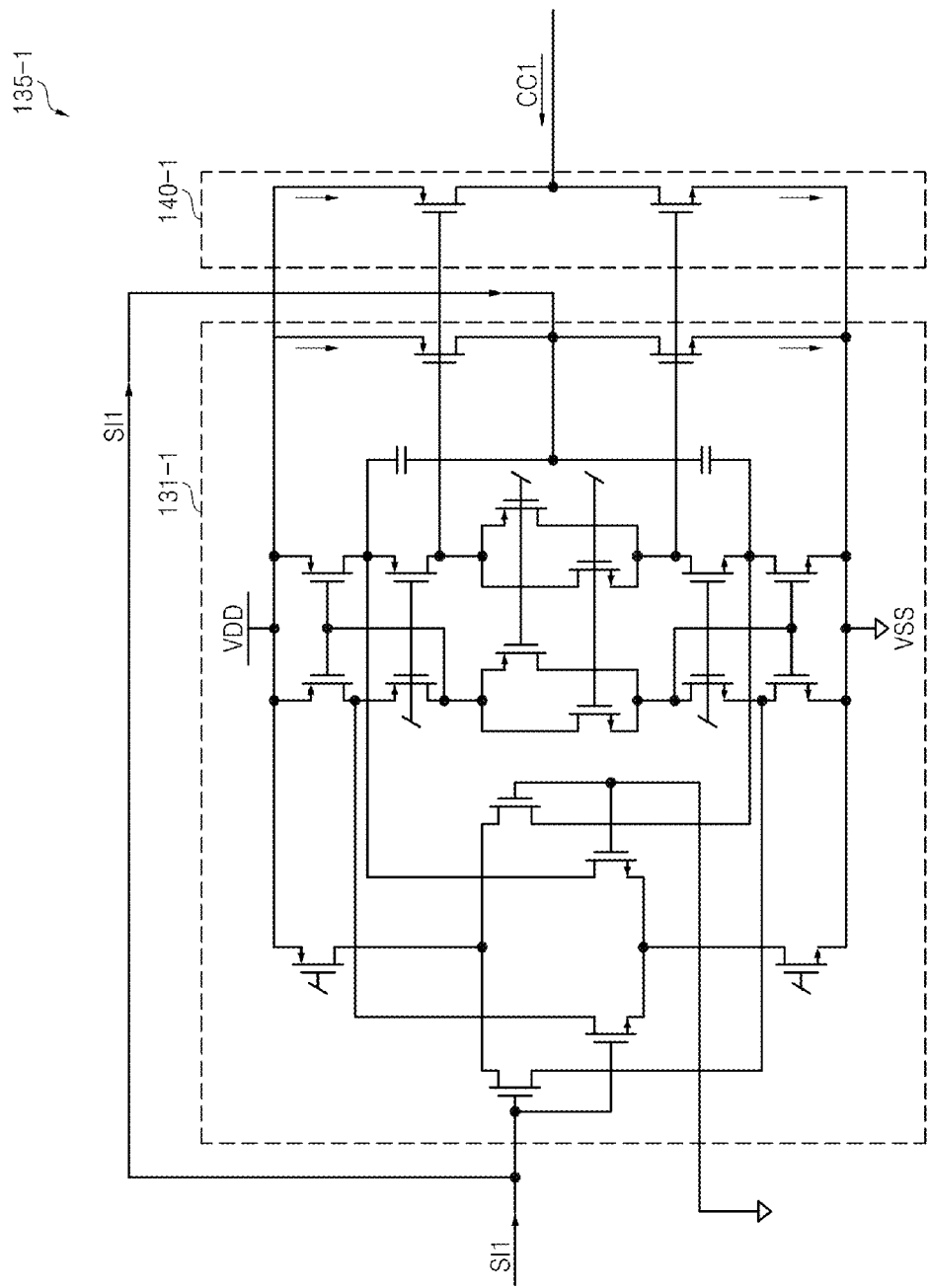
FIG. 15 is a block diagram of a first current conveyer illustrated in FIG. 14.

FIG. 15 is a block diagram of the first current conveyer illustrated in FIG. 14. Referring to FIGS. 14 and 15, the current conveyer 135-1 includes the unity gain buffer amplifier 130-1 and a first current copy circuit 140-1.

The unity gain buffer amplifier 130-1 includes an operational amplifier 131-1. The operational amplifier 131-1 includes an inverting terminal receiving the first current SI1, a non-inverting terminal connected to a ground and an output terminal connected to the inverting terminal. The first current copy circuit 140-1 has an operation similar to the current copy circuit 140 illustrated in FIG. 6, so that detailed explanation for this is omitted.

Each of the first current SIGi and the control current CC in FIG. 6 corresponds to each of the first current SI1 and the first control current CC1 in FIG. 15. Whereas a non-inverting terminal IN2 of the operational amplifier 131 is connected to a first alternating voltage Vin1 in FIG. 6, a non-inverting terminal of the operational amplifier 131-1 is connected to a reference voltage in FIG. 14. For example, the reference voltage may be a ground voltage.

A second current conveyer 135-2 senses the second current SI2 and extracts a sensed second current SI2 as a second control current CC2. A detailed operation of the second current conveyer 135-2 will be explained in FIG. 16.

A charge amplifier 150-1 converts a current difference (CC2−CC1) between the first control current CC1 and the second control current CC2 into an output voltage Vout. Each of the first current SI1 and the second current SI2 includes a display noise transmitted by a parasitic element. By converting a current difference between the first control current CC1 and the second control current CC2 into an output voltage Vout1, a display noise may be removed.

The charge amplifier 150-1 includes an inverting terminal connected to the first current copy circuit 140-1 and the second current copy circuit 160-1, a non-inverting terminal connected to a ground, and an output terminal outputting an output voltage Vout1. Moreover, the charge amplifier 150-1 includes feedback resistance Rf and a feedback capacitor Cf connected in parallel between the inverting terminal and the output terminal.

The receiver 110-1 further includes an analog digital converter ADC and a FIR filter. The ADC (not shown) converts an output voltage output from each charge amplifier 150-1, 150-2, . . . or 150-r into a digital signal. The FIR filter is used to remove a noise of the digital signal. The noise-removed digital signal is transmitted to the MCU 51-1.

Figure 16:
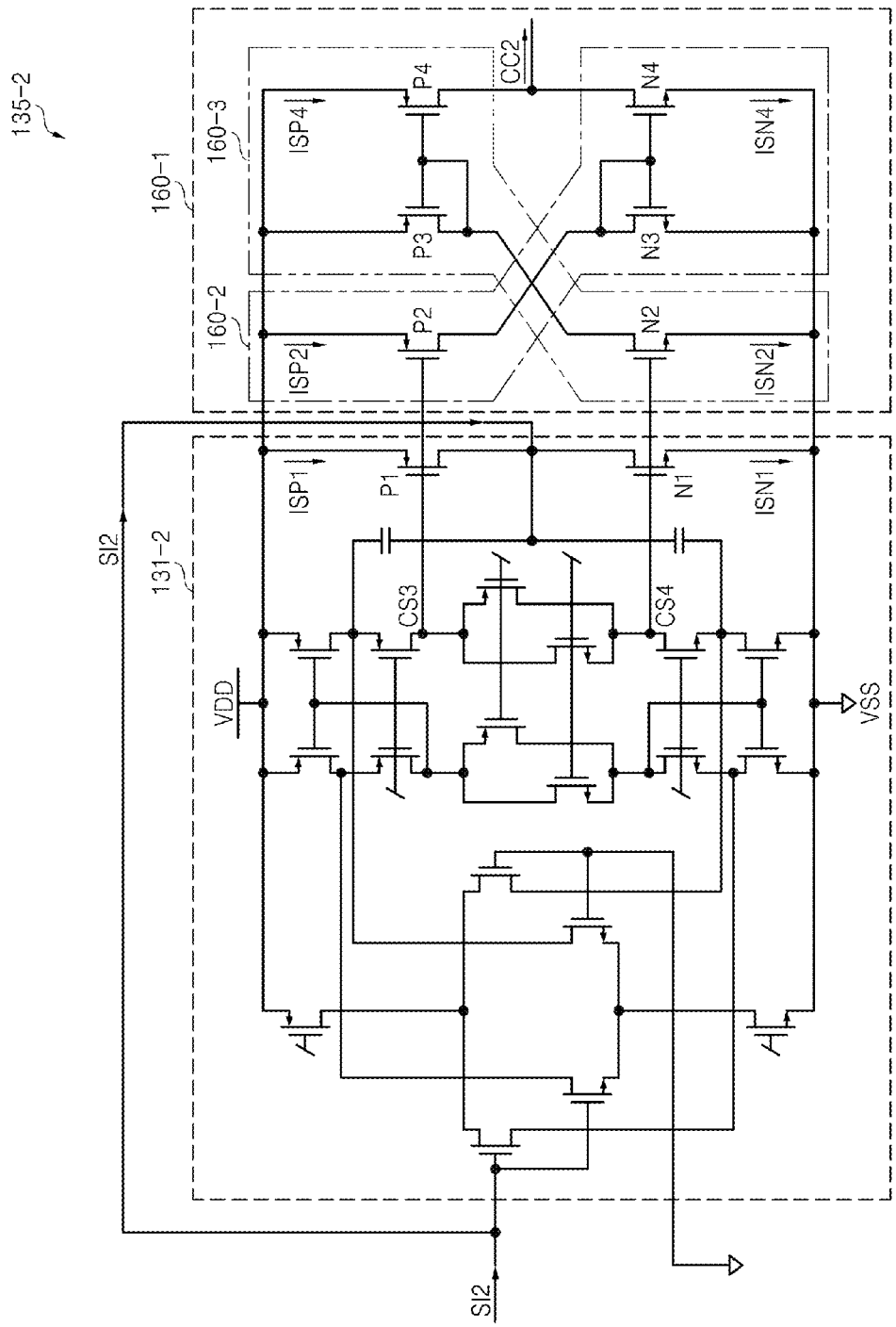
FIG. 16 is a block diagram of a second current conveyer illustrated in FIG. 14.

FIG. 16 is a block diagram of the second current conveyer illustrated in FIG. 14. Referring to FIGS. 14 and 16, the second current conveyer 135-2 includes a unity gain buffer amplifier 130-2 and a second current copy circuit 160-1.

The unity gain buffer amplifier 130-2 includes an inverting input terminal receiving a second current SI2, a non-inverting input terminal receiving a ground voltage, and an output terminal connected to the inverting terminal. The unity gain buffer amplifier 130-2 includes an operational amplifier 131-2. The operational amplifier 131-2 is similar to the operational amplifier 131 illustrated in FIG. 6, so that detailed explanation for this is omitted. The non-inverting terminal of the operational amplifier 131-2 is connected to a ground.

Similarly to the first current SIGi of FIG. 6, the second current SI2 is equal to a difference between a currents ISP1 and a current ISN1 flowing in the operational amplifier 131-2. The second current SI2 may be expressed as shown in equation 3.

$$SI2 = ISP1 - ISN1 \qquad \text{[Equation 3]}$$

The current ISP1 is a current flowing in a first transistor P1 in response to a first control voltage CS3 and the current ISN1 is a current flowing in a second transistor N1 in response to a second control voltage CS4.

The second current copy circuit 160-1 outputs a second control current CC2 according to a plurality of control voltages CS3 and CS4 output from the unity gain buffer amplifier 130-2. The second current copy circuit 160-1 includes a first current mirror 160-2 and a second current mirror 160-3. Each of the first current mirror 160-2 and the second current mirror 160-3 is connected between a power node VDD and a ground node VSS. Each of the first current mirror 160-2 and the second current mirror 160-3 includes a plurality of transistors P2, P3, P4, N2, N3 and N4.

A current ISN4 which copied a current ISP2 flowing in one side of the first current minor 160-2 flows in the other side of the first current minor 160-2 in response to a first control voltage CS3. A current ISP4 which copied a current ISN2 flowing in one side of the second current mirror 160-3 flows in the other side of the second current mirror 160-3 in response to a second control voltage CS4.

A second control current CC2 may be expressed as shown in equation 4.

$$-CC2 = ISN4 - ISP4 \qquad \text{[Equation 4]}$$

A size (length and width) of each of a plurality of transistors MP1, MP2, MN1 and MN2 is the same as one another. A first transistor P1 and a third transistor P2 are controlled by a third control voltage CS3, and a second transistor N1 and a fourth transistor N2 are controlled by a fourth control voltage CS4. Accordingly, an amount of a current ISP1 flowing in the first transistor P1 is the same as an amount of a current ISP2 flowing in the third transistor P2, and an amount of a current ISN1 flowing in the second transistor N1 is the same as an amount of a current ISN2 flowing in the fourth transistor N2.

An amount of a current ISN4 is the same as an amount of a current ISP2 and an amount of a current ISP4 is the same as an amount of a current ISN2 according to current minoring. Therefore, an amount of a current ISN4 is the same as an amount of a current ISP1, and an amount of a current ISP4 is the same as an amount of a current ISN1.

By connecting a plurality of current mirrors 160-3 and 160-4 to the unity gain buffer amplifier 130-2, and sensing the second current SI2, the sensed second current SI2 is extracted as a second control current CC2.

Figure 17:
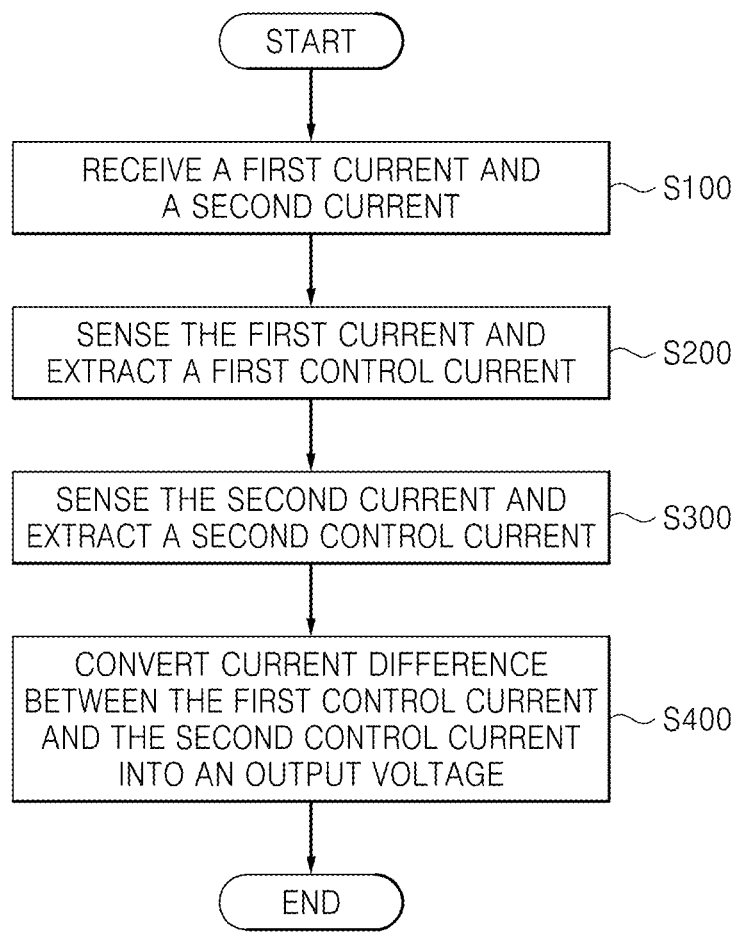
FIG. 17 is a flowchart for explaining an operating method of a receiver illustrated in FIG. 14.

FIG. 17 is a flowchart for explaining an operating method of the receiver illustrated in FIG. 14. Referring to FIGS. 14 to 17, the receiver 110-1 receives a first current SI1 and a second current SI2 (S10).

The first current conveyer 135-1 senses a first current SI1 and extracts a sensed first current SI1 as a first control current CC1 (S20). The second current conveyer 135-2 senses a second current SI2 and extracts a sensed second current SI2 as a second control current CC2 (S30).

The charge amplifier 150-1 transmits a charge corresponding to difference (CC2−CC1) between a first control current CC1 and a second control current CC2 to a feedback capacitor Cf, and generates an output voltage Vout corresponding to a voltage passing through the feedback capacitor Cf (S40). Accordingly, the display noise may be removed.

A touch controller according to an example embodiment of inventive concepts, an operating method thereof, and devices having the same may remove a display noise occurred at a display common electrode by sensing differentially two of a plurality of channels. In addition, the touch controller according to an example embodiment of inventive concepts, the operating method thereof, and the devices having the same may remove a noise occurred by mismatch between parasitic elements by compensating mismatch between parasitic elements.

While example embodiments have been particularly shown and described with reference to embodiments thereof, it will be understood by those of ordinary skill in the art that various changes in forms and details may be made therein without departing from the spirit and scope as defined by the following claims.

What is claimed is:

1. A touch controller comprising:
   a plurality of pins each connected to one of a plurality of channels;
   a selector for selecting two of the plurality of channels in response to a selection signal; and
   a differential sensing block configured to convert a charge corresponding to a difference between a first current and a second current flowing in each of the two channels into an output voltage.

2. The touch controller of claim 1, wherein the differential sensing block comprises:
   a current conveyer configured to sense the first current and extract the sensed first current as a control current; and
   a charge amplifier configured to convert a current difference between the second current and the control current into the output voltage.

3. The touch controller of claim 2, wherein the current conveyer comprises:
   a unity gain buffer amplifier including a first input terminal configured to receive the first current, a second input terminal configured to receive an alternating voltage, and a first output terminal connected to the first input terminal; and
   a current copy circuit including a second output terminal, the current copy circuit for extracting the control current according to a plurality of control voltages output from the unity gain buffer amplifier.

4. The touch controller of claim 3, wherein the current copy circuit comprises:
   a sourcing circuit and a sinking circuit connected in series between a power node and a ground node of the unity gain buffer amplifier,
   wherein each of the sourcing circuit and the sinking circuit is configured to operate based on the plurality of control voltages.

5. The touch controller of claim 4, wherein the control current is a difference between a current flowing in the sinking circuit and a current flowing in the sourcing circuit.

6. The touch controller of claim 1, wherein, if a plurality of sensors connected to each of the plurality of channels are not touched, the charge amplifier is configured to output a reference voltage as the output voltage.

7. The touch controller of claim 1, further comprising:
a mismatch compensation block connected to a display common electrode, the mismatch compensation block configured to compensate for a mismatch between a plurality of parasitic elements between the display common electrode and a sensor electrode in response to the output voltage.

8. The touch controller of claim 7, wherein the mismatch compensation block comprises:
a capacitor array including a plurality of capacitors; and
a selection bit generator configured to compare the output voltage with a comparison voltage to select at least one of the plurality of capacitors and generate a plurality of selection bits according to a comparison result.

9. The touch controller of claim 8, wherein the selection bit generator comprises:
a comparator configured to compare the comparison voltage with the output voltage and output a comparison signal; and
a successive approximation register (SAR) control logic configured to generate the plurality of selection bits in response to the comparison signal.

10. The touch controller of claim 9, wherein the SAR control logic is configured to generate a compensation clock signal and supply the compensation clock signal to a source driver.

11. A touch controller comprising:
a plurality of pins each connected to a plurality of channels;
a first current conveyer configured to sense a first current flowing in one of the plurality of channels and extract the sensed first current as a first control current;
a second current conveyer configured to sense a second current flowing in another channel of the plurality of channels and extract the sensed second current as a second control current; and
a charge amplifier configured to convert a current difference between the first control current and the second control current into an output voltage.

12. The touch controller of claim 11, further comprising:
a plurality of driving pins connected to the plurality of driving channels, and
an integrated circuit configured to supply a sign pulse signal to each of the plurality of driving channels.

13. The touch controller of claim 11, wherein the first current conveyer comprises:
a unity gain buffer amplifier including an inverting input terminal configured to receive the first current, a non-inverting input terminal configured to receive a reference voltage, and an output terminal connected to the inverting terminal; and
a current copy circuit configured to extract the first control current according to a plurality of control voltages output from the unity gain buffer amplifier.

14. The touch controller of claim 13, wherein the current copy circuit comprises:
a sourcing circuit and a sinking circuit connected in series between a power node and a ground node of the unity gain buffer amplifier,
wherein each of the sourcing circuit and the sinking circuit is configured to operate based on the plurality of control voltages.

15. The touch controller of claim 11, wherein the second current conveyer comprises:
a unity gain buffer amplifier including an inverting input terminal configured to receive the second current, a non-inverting input terminal configured to receive a reference voltage, and an output terminal connected to the inverting terminal; and
a current copy circuit configured to extract the second control current according to a plurality of control voltages output from the unity gain buffer amplifier.

16. The touch controller of claim 15, wherein the current copy circuit comprises:
a plurality of current mirrors each connected between a power node and a ground node of the unity gain buffer amplifier,
wherein each of the plurality of current mirrors is configured to operate based on the plurality of control voltages.

17. A touch display system comprising:
a touch display panel; and
a touch controller connected to the touch display panel by a plurality of channels,
wherein the touch controller includes,
a current conveyer configured to sense a first current among a plurality of currents flowing through each of the plurality of channels and extract the sensed first current as a control current; and
a charge amplifier configured to convert a charge corresponding to a difference between the control current and a second current among the plurality of currents into an output voltage.

18. The touch display system of claim 17, wherein the touch display system is a portable device.

19. A touch display system comprising:
a display panel configured to produce a plurality of currents through a plurality of channels, respectively;
an integrated circuit coupled to the plurality of channels, the integrated circuit including,
a differential sensor configured to receive a first current associated with a first channel and a second current associated with a second channel, generate a charge corresponding to a difference between the first and second currents, and convert the charge into an output voltage.

20. The touch display system of claim 19, wherein the integrated circuit further includes,
a mismatch compensator configured to compensate for parasitic capacitances in the display panel based on the output voltage.

21. The touch display system of claim 20, wherein the mismatch compensator includes,
a bit selection generator configured to receive the output voltage, compare the output voltage to a comparison voltage and generate a plurality of selection bits based on the comparison, and
a capacitor array configured to select at least one of a plurality of capacitors based on the plurality of selection bits to compensate for the parasitic capacitances.

22. The touch display system of claim 20, wherein the mismatch compensator is configured to selectively change a capacitance between a sensor electrode and a display common electrode to compensate for parasitic capacitances in the display panel.

* * * * *